United States Patent
Hsu et al.

(10) Patent No.: US 9,852,973 B2
(45) Date of Patent: Dec. 26, 2017

(54) MANUFACTURING METHOD OF CHIP PACKAGE AND PACKAGE SUBSTRATE

(71) Applicant: MediaTek Inc., Hsin-Chu (TW)

(72) Inventors: Wen-Sung Hsu, Zhubei (TW); Ta-Jen Yu, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/455,200

(22) Filed: Mar. 10, 2017

(65) Prior Publication Data

US 2017/0186709 A1     Jun. 29, 2017

Related U.S. Application Data

(62) Division of application No. 14/602,539, filed on Jan. 22, 2015, now Pat. No. 9,627,311.

(51) Int. Cl.
| | |
|---|---|
| H01L 21/336 | (2006.01) |
| H01L 29/40 | (2006.01) |
| H01L 23/498 | (2006.01) |
| H01L 21/768 | (2006.01) |
| H01L 23/538 | (2006.01) |

(52) U.S. Cl.
CPC .. *H01L 23/49827* (2013.01); *H01L 21/76898* (2013.01); *H01L 23/5384* (2013.01)

(58) Field of Classification Search
CPC ........... H01L 23/5223; H01L 27/10829; H01L 23/49827; H01L 21/76898
USPC .................. 257/776, 698, 676; 438/280, 667
See application file for complete search history.

(56) References Cited

U.S. PATENT DOCUMENTS

| | | | |
|---|---|---|---|
| 7,936,567 B2 * | 5/2011 | Takashima | .......... H01L 21/4857 361/761 |
| 8,598,695 B2 | 12/2013 | Oganesian et al. | |
| 8,610,250 B2 | 12/2013 | Lai | |
| 8,698,278 B2 | 4/2014 | Muramatsu et al. | |
| 8,987,897 B2 | 3/2015 | Chan et al. | |
| 9,000,581 B2 | 4/2015 | Chen et al. | |
| 9,093,459 B2 * | 7/2015 | Chou | ................... H01L 21/568 257/675 |
| 9,345,142 B2 * | 5/2016 | Moon | .................... H05K 1/185 22/34 |
| 2003/0085058 A1 | 5/2003 | Komatsu et al. | |
| 2005/0001329 A1 | 1/2005 | Matsuki et al. | |
| 2006/0003495 A1 | 1/2006 | Sunohara et al. | |
| 2008/0061427 A1 | 3/2008 | Chiang | |
| 2009/0290317 A1 | 11/2009 | Mashino | |

(Continued)

FOREIGN PATENT DOCUMENTS

| | | |
|---|---|---|
| EP | 1137332 A1 | 9/2001 |
| EP | 1445994 A1 | 8/2004 |

(Continued)

*Primary Examiner* — Calvin Lee
(74) *Attorney, Agent, or Firm* — McClure, Qualey & Rodack, LLP

(57) ABSTRACT

A manufacturing method of a package substrate is provided. The method includes forming a first circuit layer on a carrier. A passive component is disposed on the first circuit layer and the carrier. A dielectric layer is formed on the carrier to embed the passive component and the first circuit layer in the dielectric layer. A second circuit layer is formed on the dielectric layer. The carrier is removed from the dielectric layer. A manufacturing method of a chip package is also provided.

20 Claims, 20 Drawing Sheets

(56) References Cited

U.S. PATENT DOCUMENTS

| | | |
|---|---|---|
| 2010/0006994 A1 | 1/2010 | Shim et al. |
| 2012/0037404 A1 | 2/2012 | Hsu et al. |
| 2014/0239475 A1 | 8/2014 | Lin et al. |
| 2015/0022984 A1* | 1/2015 | Jung ................ H01L 23/13 361/762 |
| 2016/0118325 A1* | 4/2016 | Wang ............ H01L 23/5389 257/774 |

FOREIGN PATENT DOCUMENTS

| | | |
|---|---|---|
| TW | 201230282 A1 | 7/2012 |
| TW | 201349412 A | 12/2013 |
| TW | 201434121 A | 9/2014 |
| TW | 201436171 A | 9/2014 |
| WO | 9417549 A1 | 8/1994 |
| WO | 0203463 A2 | 1/2002 |

* cited by examiner

MANUFACTURING METHOD OF CHIP PACKAGE AND PACKAGE SUBSTRATE

CROSS REFERENCE TO RELATED APPLICATIONS

This application is a Divisional of U.S. patent application Ser. No. 14/602,539, filed Jan. 22, 2015, now U.S. Pat. No. 9,627,311 issued Apr. 18, 2017, and entitled "Chip Package, Package Substrate and Manufacturing Method Thereof", the entirety of which is incorporated by reference herein.

BACKGROUND OF THE INVENTION

Field of the Invention

The present invention relates to a package substrate, and in particular relates to a package substrate with a passive component embedded therein and manufacturing methods thereof and a chip package having the package substrate.

Description of the Related Art

Along with the rapid development of semiconductor packaging technologies, different chip package types have been developed for semiconductor devices. To reduce the height of chip packages so as to meet the miniaturization or thinning requirements of products, semiconductor components are generally embedded in the cavities of package substrates so as to reduce the volume of the overall semiconductor devices.

In general, the package substrate uses a core layer to support chips thereon. However, the core layer is very expensive. Therefore, methods for lowering the manufacturing cost of chip packages are required.

BRIEF SUMMARY OF THE INVENTION

An embodiment of the invention provides a package substrate which includes: a dielectric layer; a passive component embedded in the dielectric layer and contacting the dielectric layer; and a circuit layer embedded in the dielectric layer and having a first surface aligned with a second surface of the dielectric layer.

An embodiment of the invention provides a chip package, which includes: a package substrate including: a dielectric layer; a passive component embedded in the dielectric layer and contacting the dielectric layer; a first circuit layer embedded in the dielectric layer and having a first surface aligned with a second surface of the dielectric layer; and a chip disposed on the package substrate and electrically connected to the first circuit layer and the passive component.

An embodiment of the invention provides a manufacturing method of a package substrate, which includes: forming a first circuit layer on a carrier; disposing a passive component on the first circuit layer and the carrier; forming a dielectric layer on the carrier to embed the passive component and the first circuit layer in the dielectric layer; forming a second circuit layer on the dielectric layer; and removing the carrier from the dielectric layer.

An embodiment of the invention provides a manufacturing method of a chip package substrate, which includes: forming a first circuit layer on a carrier; disposing a passive component on the first circuit layer and the carrier; forming a dielectric layer on the carrier to embed the passive component and the first circuit layer in the dielectric layer; forming a second circuit layer on the dielectric layer; removing the carrier from the dielectric layer; and disposing a chip on the first circuit layer, wherein the chip is electrically connected to the first circuit layer and the passive component.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It should be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
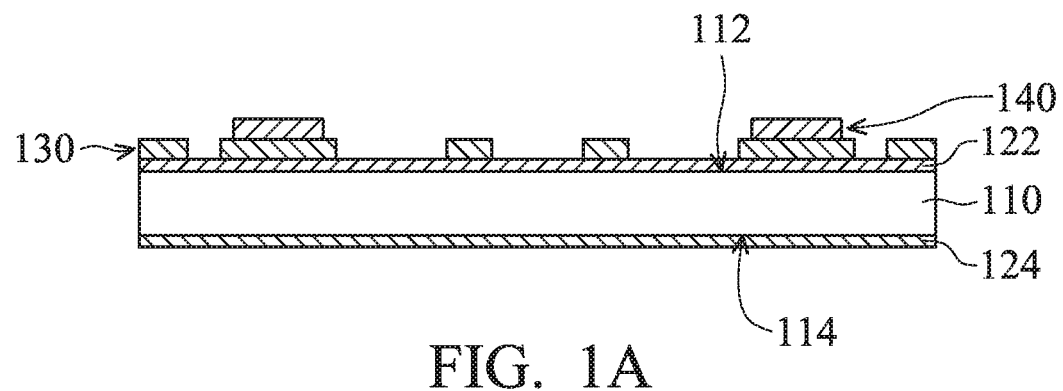
FIGS. 1A-1I are cross-sectional views showing the steps of forming a chip package in accordance with an embodiment of the present invention.

FIGS. 1A-1I are cross-sectional views showing the steps of forming a chip package in accordance with an embodiment of the present invention. As shown in FIG. 1A, a carrier 110 is provided, and the carrier 110 has two opposite surfaces 112 and 114. The carrier 110 includes resin, polytetrafluoroethene or other materials suitable for support of electronic components.

In one embodiment, conductive layers 122 and 124 are formed on the surfaces 112 and 114, respectively. A circuit layer 130 is formed on the conductive layer 122 by, for example, performing an electroplating process, a photolithography process and an etching process. In one embodiment, a conductive layer 140 is formed on a portion of the circuit layer 130 whereon conductive vias will be formed in subsequent processes. The conductive layer 140 is formed by, for example, performing an electroplating process, a photolithography process and an etching process. The conductive layers 122 and 124, the circuit layer 130 and the conductive layer 140 include copper or other suitable conductive materials.

Figure 1B:
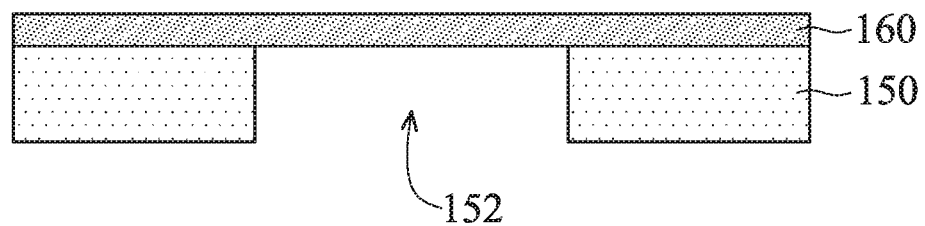

As shown in FIG. 1B, a first dielectric material layer 150 and an adhesive layer 160 are provided. The adhesive layer 160 is disposed on the first dielectric material layer 150. The first dielectric material layer 150 has a cavity 152 exposing a portion of the adhesive layer 160. The first dielectric material layer 150 includes resin or other suitable dielectric materials. The adhesive layer 160 includes epoxy or other suitable adhesive materials.

Figure 1C:
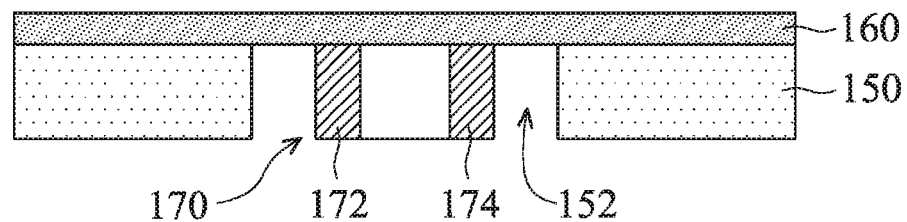

Thereafter, as shown in FIG. 1C, a passive component 170 is disposed in the cavity 152 to be adhered on the adhesive layer 160. The passive component 170 includes a capacitor, an inductor, a resistor or other suitable passive components. In one embodiment, the passive component 170 is a capacitor, and the passive component 170 has electrode pads 172 and 174 disposed at two opposite ends thereof, respectively.

Figure 1D:
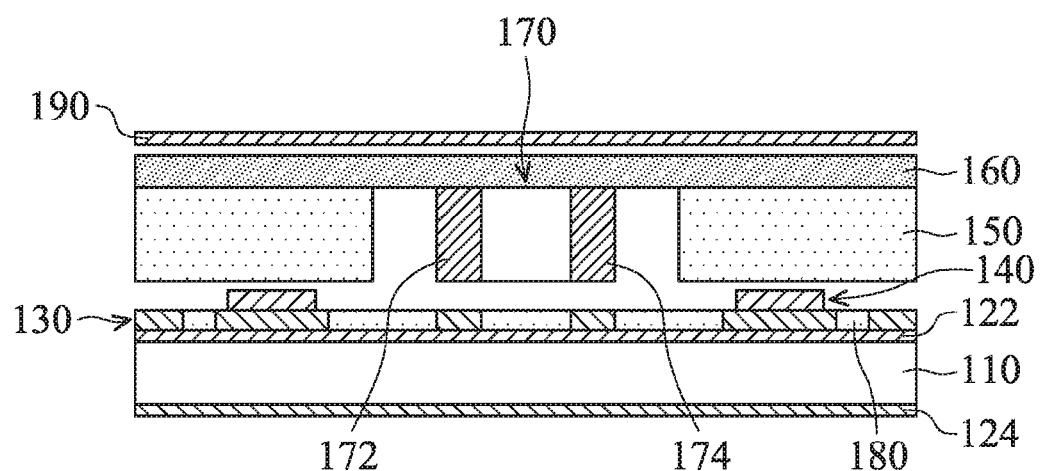

Afterwards, as shown in FIG. 1D, a second dielectric material layer 180 is formed on the conductive layer 122 and is adjacent to the circuit layer 130. Specifically, the circuit layer 130 is embedded in the second dielectric material layer 180. The second dielectric material layer 180 has the same material as the first dielectric material layer 150. Then, a conductive layer 190, the adhesive layer 160, the first dielectric material layer 150 and the passive component 170 are stacked on the carrier 110. The conductive layer 190 includes copper or other suitable conductive materials.

Figure 1E:
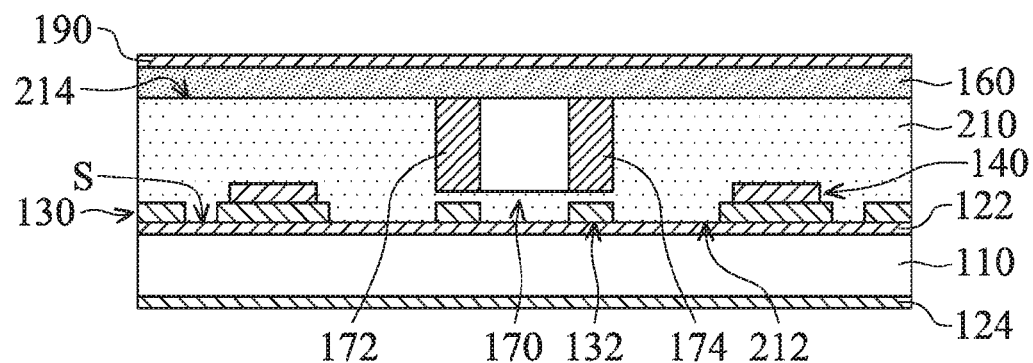

Thereafter, as shown in FIG. 1E, a lamination process is performed to combine the first dielectric material layer 150 with the second dielectric material layer 180 so as to form a dielectric layer 210. The dielectric layer 210 is, for example, an integral layer includes the same material as the first dielectric material layer 150 (or the second dielectric material layer 180). The dielectric layer 210 fills the gaps between the passive component 170, the first dielectric material layer 150, the second dielectric material layer 180, the circuit layer 130 and the conductive layer 140 (as shown in FIG. 1D).

Therefore, the passive component 170, the circuit layer 130 and the conductive layer 140 are embedded in the dielectric layer 210. In one embodiment, the passive component 170, the circuit layer 130 and the conductive layer 140 are in direct contact with the dielectric layer 210. Since the dielectric layer 210 and the circuit layer 130 are both formed on a surface S of the conductive layer 122, a surface 212 of the dielectric layer 210 is aligned with a surface 132 of the circuit layer 130. The adhesive layer 160 is disposed on a surface 214 of the dielectric layer 210, and the surface 214 is opposite to the surface 212. Furthermore, the conductive layer 190 is adhered onto the adhesive layer 160.

Figure 1F:
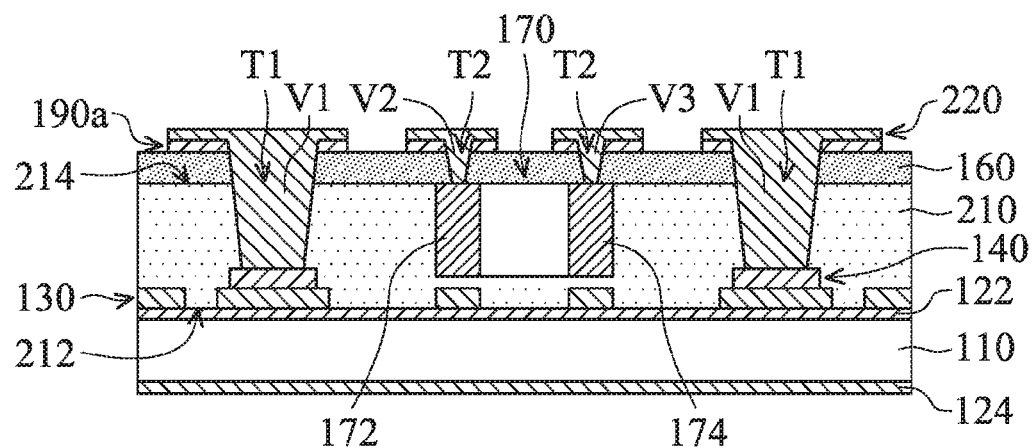

Afterwards, as shown in FIGS. 1E and 1F, holes T1 and T2 are formed by, for example, a laser drilling process. The holes T1 pass through the conductive layer 190, the adhesive layer 160 and the dielectric layer 210. The holes T2 pass through the conductive layer 190 and the adhesive layer 160. Then, a conductive layer (not shown) is formed on the conductive layer 190 by, for example, an electroplating process, and the conductive layer fills the holes T1 and T2 to form conductive vias V1, V2 and V3. It should be noted that the aspect ratio of the holes T1 is reduced by the conductive layer 140, which helps the conductive layer to fill the holes T1.

Thereafter, the conductive layer 190 and the conductive layer formed thereon are patterned to form circuit layers 190a and 220 on the surface 214 of the dielectric layer 210. The patterning process includes, for example, a photolithography process and an etching process. Each of the conductive vias V1 passes through the circuit layer 190a, the adhesive layer 160 and the dielectric layer 210 and is electrically connected to the circuit layers 190a and 220, the conductive layer 140 and the circuit layer 130.

The conductive via V2 passes through the circuit layer 190a and the adhesive layer 160 and is electrically connected to the circuit layers 190a and 220 and the electrode pad 172 of the passive component 170. The conductive via V3 passes through the circuit layer 190a and the adhesive layer 160 and is electrically connected to the circuit layers 190a and 220 and the electrode pad 174 of the passive component 170.

In some other embodiments (not shown), the manufacturing processes performed on the conductive layer 122 are also performed on the conductive layer 124 to form the same structure as that formed on the conductive layer 122. Therefore, the carrier 110 may be used to fabricate (or support) two package substrates simultaneously.

Figure 1G:
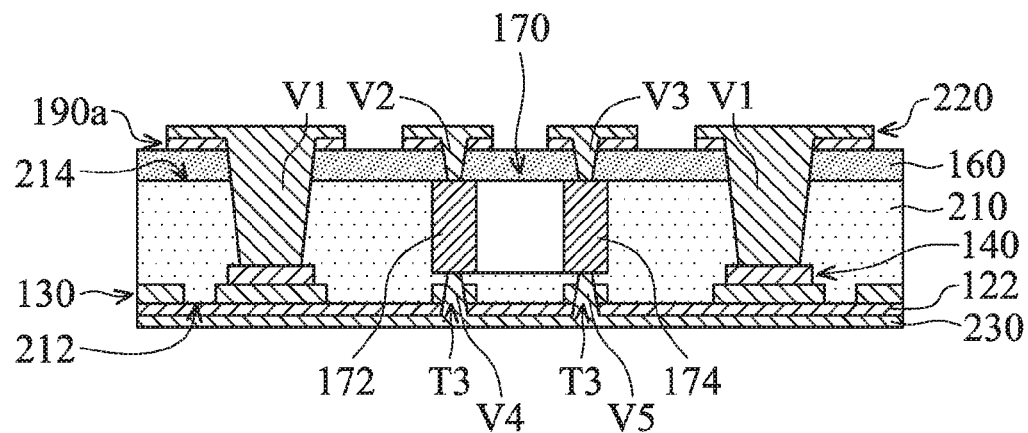
Figure 1H:
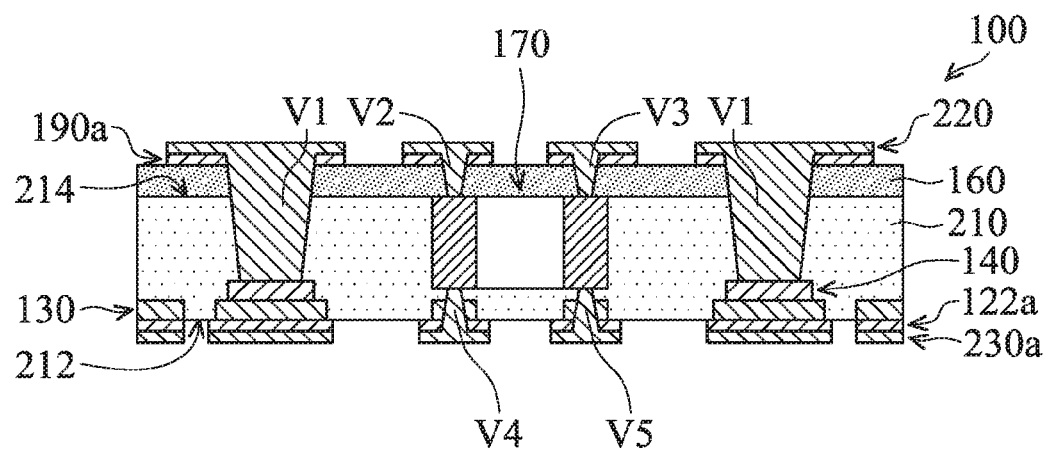

Afterwards, as shown in FIG. 1G, the carrier 110 and the conductive layer 124 are removed. Holes T3 are formed to pass through the conductive layer 122, the circuit layer 130 and the dielectric layer 210 by, for example, a laser drilling process. Then, a conductive layer 230 is formed on the conductive layer 122 by, for example, an electroplating process, and the conductive layer 230 fills the holes T3 to form conductive vias V4 and V5. As shown in FIG. 1H, the conductive layers 122 and 230 are patterned to form circuit layers 122a and 230a. In this step, a package substrate 100 is substantially formed.

Figure 1I:
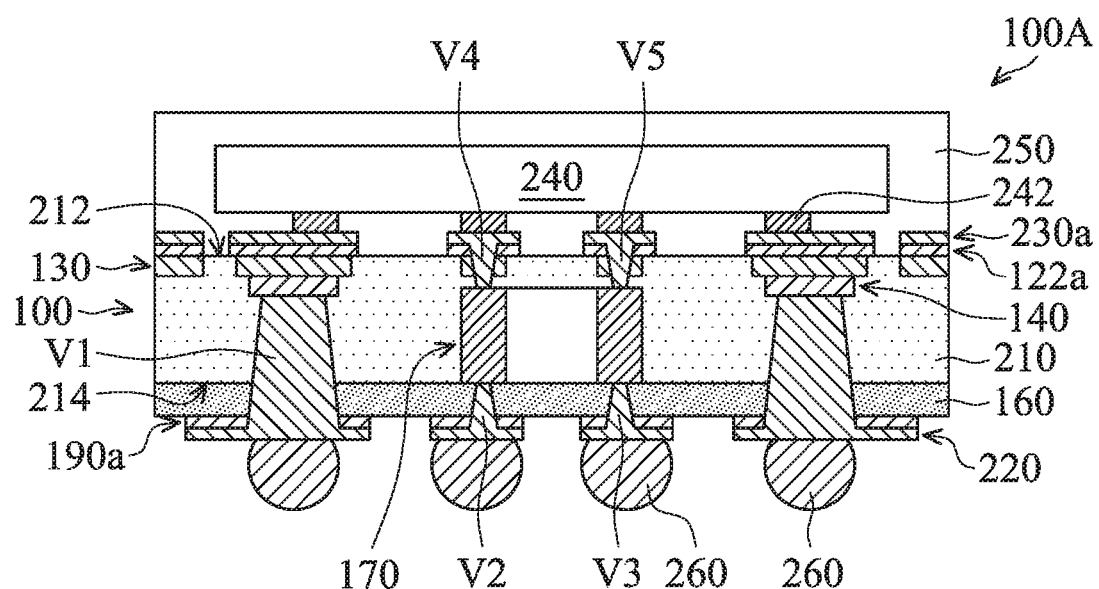

As shown in FIG. 1I, the package substrate 100 is flipped up. In one embodiment, a chip 240 is bonded onto the circuit layer 230a via conductive bumps 242 formed under the chip 240. The chip 240 is electrically connected to the passive component 170 through the circuit layer 230a and the conductive vias V4 and V5. The chip 240 is located on the surface 212 of the dielectric layer 210.

A molding process is optionally performed to form an encapsulating layer 250 on the package substrate 100 and covering (or encapsulating) the chip 240. The encapsulating layer 250 includes epoxy, acrylate, urethane acrylate or other suitable encapsulating materials. Solder balls (or conductive bumps) 260 are formed on the circuit layer 220. The solder balls include tin or other suitable solder materials. In this step, a chip package 100A of the present embodiment is substantially formed.

In the present embodiment, a lamination process is performed to embed the passive component 170 into the dielectric layer 210 so as to form the package substrate 100, and therefore the package substrate 100 of the present embodiment does not need to use a core layer. Therefore, the present embodiment may reduce the manufacturing cost of package substrates and chip packages.

FIGS. 2A-2I are cross-sectional views showing the steps of forming a chip package in accordance with an embodiment of the present invention. It should be noted that some of the elements of FIGS. 2A-2I are the same as or similar to those of FIGS. 1A-1I, and therefore same or similar reference numbers are used to designate same or similar elements. A detailed description of elements that are the same or similar to those in FIGS. 1A-1I is not repeated herein.

Figure 2A:
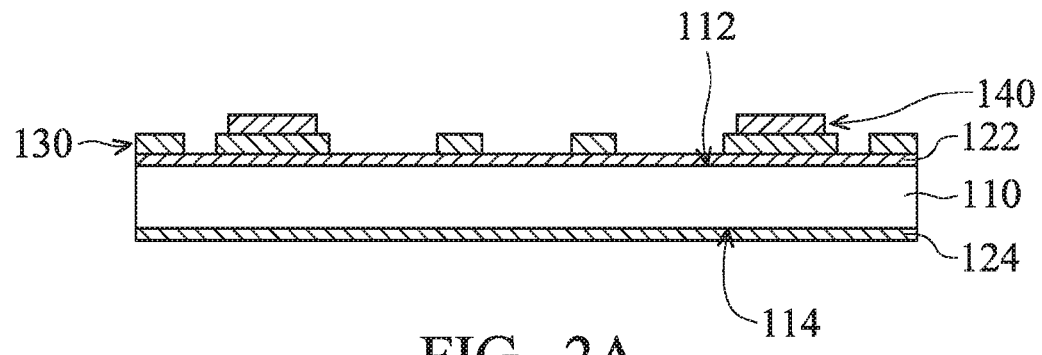
FIGS. 2A-2I are cross-sectional views showing the steps of forming a chip package in accordance with an embodiment of the present invention.

As shown in FIG. 2A, a carrier 110, conductive layers 122 and 124, a circuit layer 130 and a conductive layer 140 are provided. The conductive layer 122, the circuit layer 130 and the conductive layer 140 are stacked on a surface 112 of the carrier 110 sequentially. The conductive layer 124 is disposed on a surface 114 of the carrier 110.

Figure 2B:
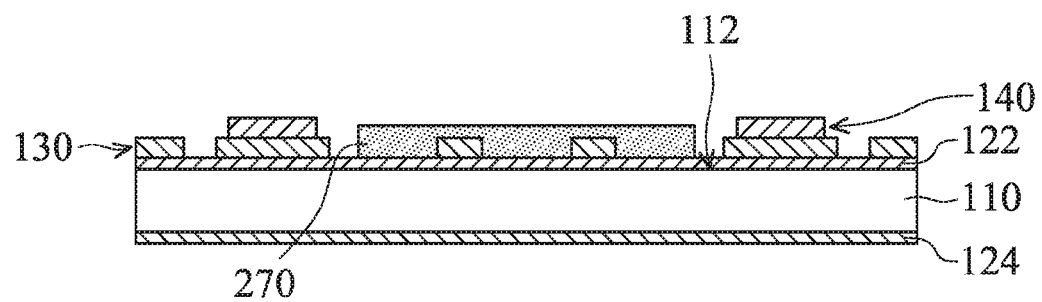
Figure 2C:
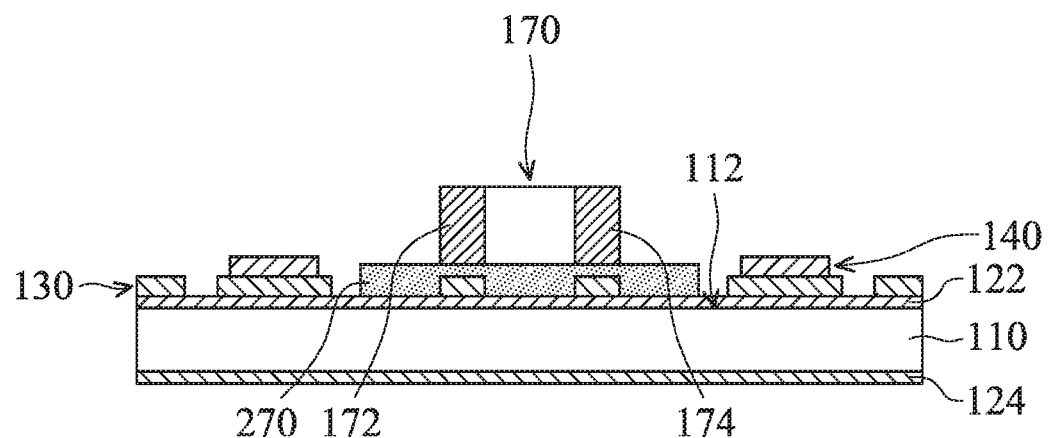

Thereafter, as shown in FIG. 2B, an adhesive layer 270 is formed on the conductive layer 122 by, for example, a printing process or a dispensing process. The adhesive layer 270 includes insulating materials, such as epoxy or other suitable adhesive materials. Afterwards, as shown in FIG. 2C, a passive component 170 is disposed on the adhesive layer 270 to be adhered on the carrier 110. In one embodiment, the passive component 170 has electrode pads 172 and 174 disposed at two opposite ends thereof, respectively.

Figure 2D:
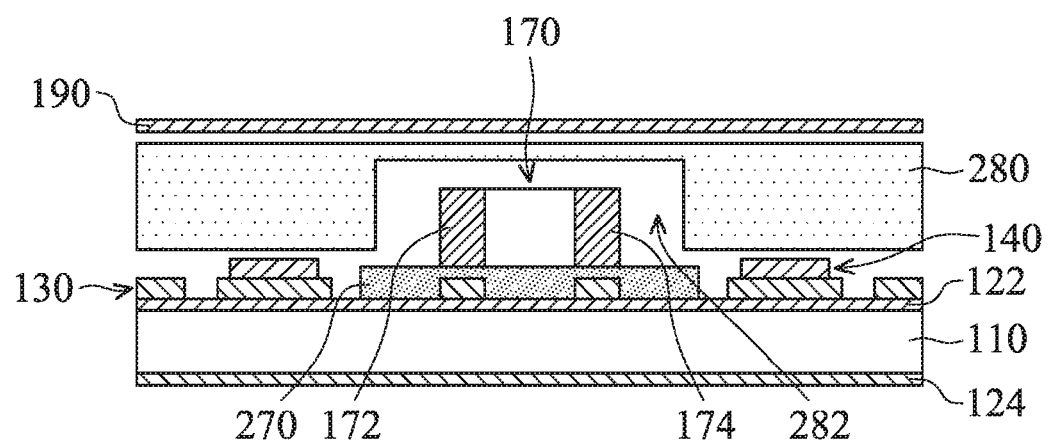

As shown in FIG. 2D, a conductive layer 190 and a dielectric material layer 280 are stacked on the carrier 110. The dielectric material layer 280 has a cavity 282 facing the passive component 170. The dielectric material layer 280 includes resin or other suitable dielectric materials.

Figure 2E:
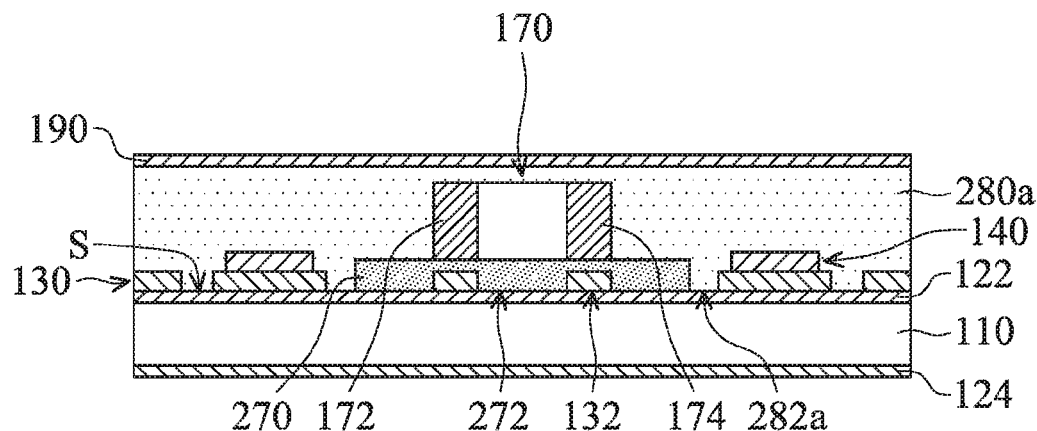

As shown in FIG. 2E, a lamination process is performed to melt the dielectric material layer 280 so as to form a dielectric layer 280a. The dielectric layer 280a fills the gaps between the passive component 170, the dielectric material layer 280, the circuit layer 130, the conductive layer 140 and the adhesive layer 270 (as shown in FIG. 2D). Therefore, the passive component 170, the circuit layer 130, the conductive layer 140 and the adhesive layer 270 are embedded in the dielectric layer 280a.

In one embodiment, the passive component 170, the circuit layer 130, the conductive layer 140 and the adhesive layer 270 are in direct contact with the dielectric layer 280a. Since the dielectric layer 280a, the adhesive layer 270 and the circuit layer 130 are formed on a surface S of the conductive layer 122, a surface 282a of the dielectric layer 280a, a surface 272 of the adhesive layer 270 and a surface 132 of the circuit layer 130 are aligned with each other. Furthermore, the conductive layer 190 is pressed onto the dielectric layer 280a.

Figure 2F:
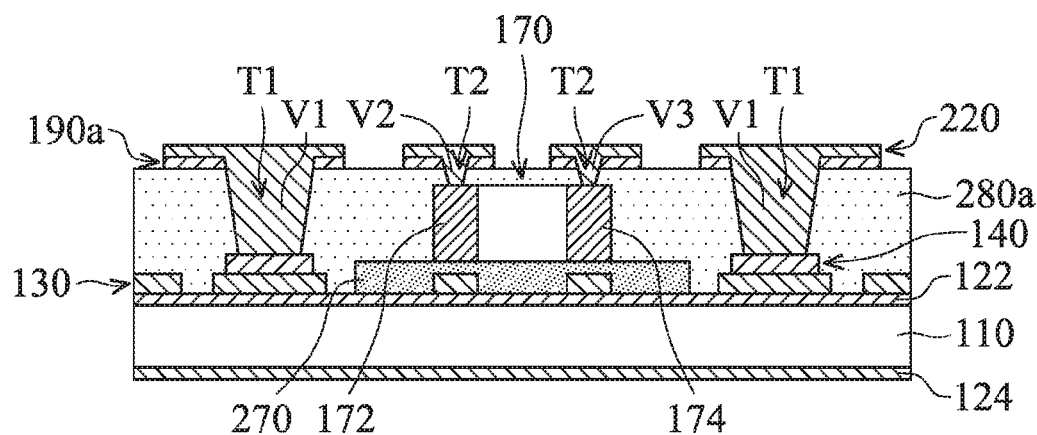

Afterwards, as shown in FIGS. 2E and 2F, holes T1 and T2 are formed by, for example, a laser drilling process. The holes T1 and T2 pass through the conductive layer 190 and the dielectric layer 280a. Then, a conductive layer (not shown) is formed on the conductive layer 190 by, for example, an electroplating process, and the conductive layer fills the holes T1 and T2 to form conductive vias V1, V2 and V3.

Thereafter, the conductive layer 190 and the conductive layer formed thereon are patterned to form circuit layers 190a and 220. The patterning process includes, for example, a photolithography process and an etching process. Each of the conductive vias V1 passes through the circuit layer 190a and the dielectric layer 280a and is electrically connected to the circuit layers 190a and 220, the conductive layer 140 and the circuit layer 130.

The conductive via V2 passes through the circuit layer 190a and the dielectric layer 280a and is electrically connected to the circuit layers 190a and 220 and the electrode pad 172 of the passive component 170. The conductive via V3 passes through the circuit layer 190a and the dielectric layer 280a and is electrically connected to the circuit layers 190a and 220 and the electrode pad 174 of the passive component 170.

Figure 2G:
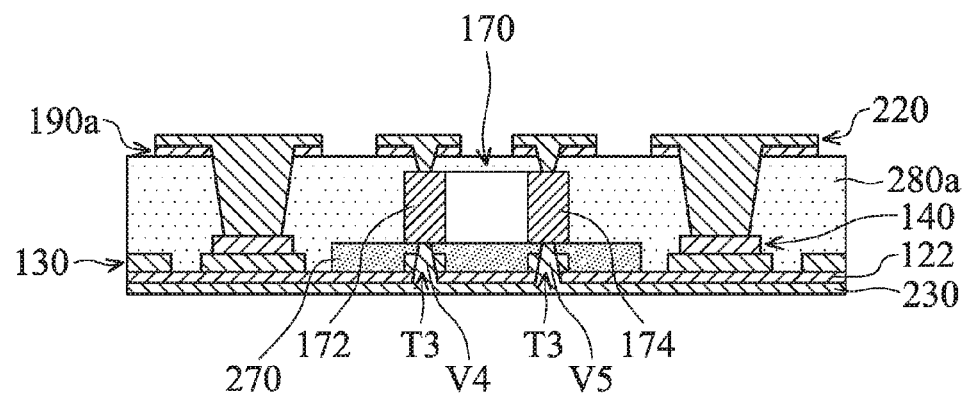
Figure 2H:
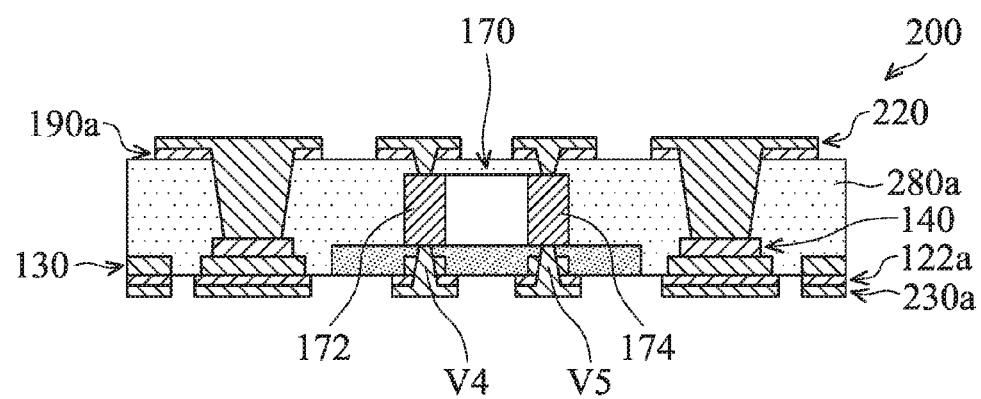

Afterwards, as shown in FIG. 2G, the carrier 110 and the conductive layer 124 are removed. Holes T3 are formed to pass through the conductive layer 122, the circuit layer 130 and the adhesive layer 270 by, for example, a laser drilling process. Then, a conductive layer 230 is formed on the conductive layer 122 by, for example, an electroplating process, and the conductive layer 230 fills the holes T3 to form conductive vias V4 and V5. As shown in FIG. 2H, the conductive layers 122 and 230 are patterned to form circuit layers 122a and 230a. In this step, a package substrate 200 is substantially formed.

Figure 2I:
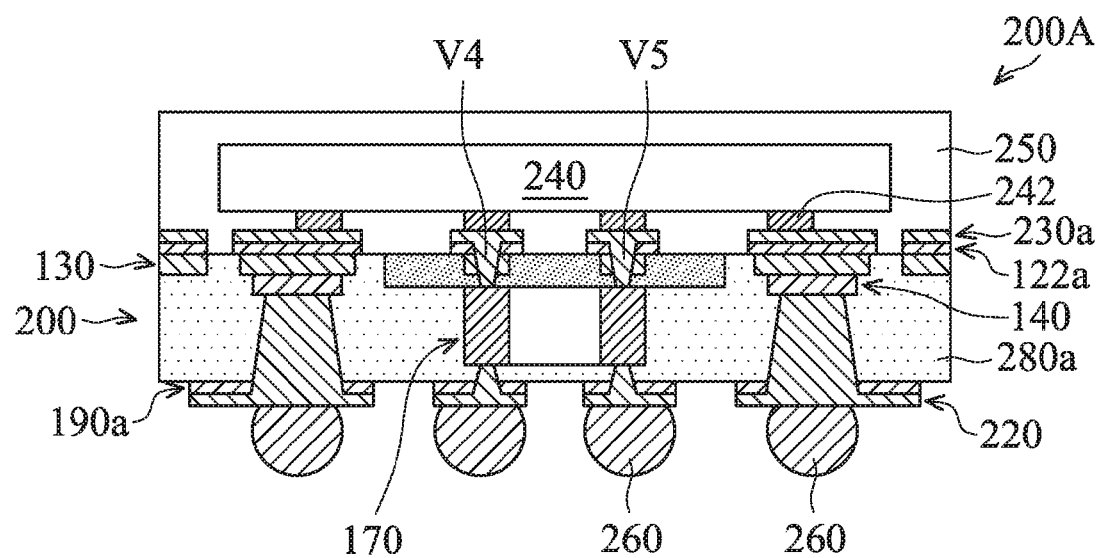

As shown in FIG. 2I, the package substrate 200 is flipped up. In one embodiment, a chip 240 is bonded onto the circuit layer 230a via conductive bumps 242 formed under the chip 240. The chip 240 is electrically connected to the passive component 170 through the circuit layer 230a and the conductive vias V4 and V5. A molding process is optionally performed to form an encapsulating layer 250 on the package substrate 200 and covering (or encapsulating) the chip 240. Solder balls (or conductive bumps) 260 are formed on the circuit layer 220. In this step, a chip package 200A of the present embodiment is substantially formed.

FIGS. 3A-3I are cross-sectional views showing the steps of forming a chip package in accordance with an embodiment of the present invention. It should be noted that some of the elements of FIGS. 3A-3I are the same as or similar to those of FIGS. 1A-1I and FIGS. 2A-2I, and therefore same or similar reference numbers are used to designate same or similar elements. A detailed description of elements that are the same or similar to those in FIGS. 1A-1I and FIGS. 2A-2I is not repeated herein.

Figure 3A:
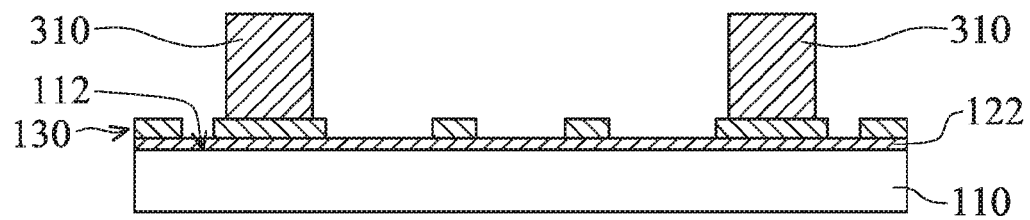
FIGS. 3A-3I are cross-sectional views showing the steps of forming a chip package in accordance with an embodiment of the present invention.

As shown in FIG. 3A, a carrier 110, conductive layer 122, a circuit layer 130 and conductive pillars 310 are provided. The conductive layer 122, the circuit layer 130 and the conductive pillars 310 are stacked on a surface 112 of the carrier 110 sequentially. The conductive pillars 310 are disposed on the circuit layer 130 and are configured to be conductive vias of a chip package subsequently formed. The conductive pillars 310 include copper or other suitable conductive materials. The conductive pillars 310 are formed by, for example, an electroplating process.

Figure 3B:
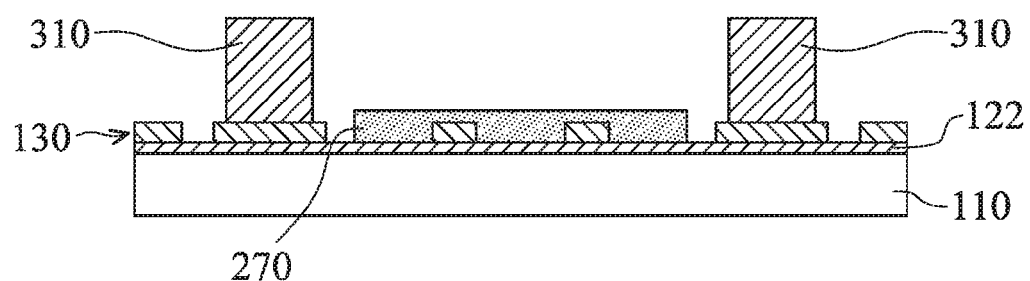
Figure 3C:
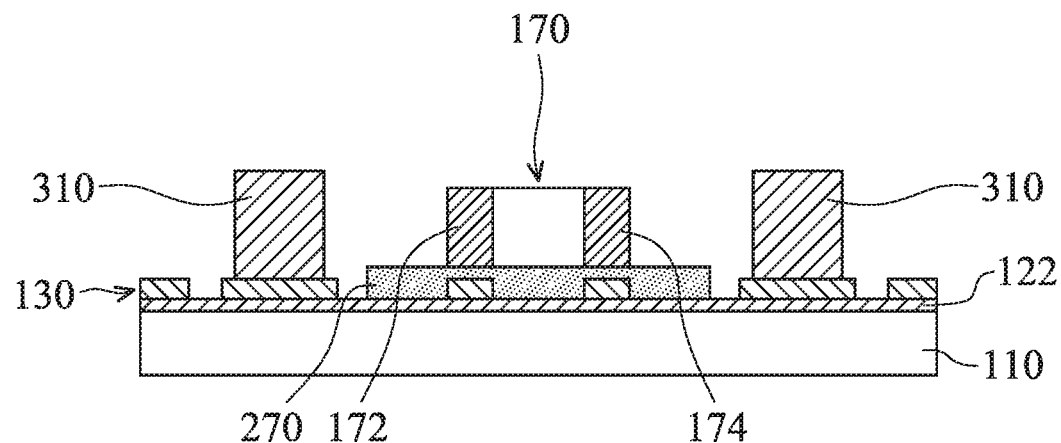

Thereafter, as shown in FIG. 3B, an adhesive layer 270 is formed on the conductive layer 122 by, for example, a printing process or a dispensing process. The adhesive layer 270 includes epoxy or other suitable adhesive materials. Afterwards, as shown in FIG. 3C, a passive component 170 is disposed on the adhesive layer 270 to be adhered on the carrier 110. In one embodiment, the passive component 170 has electrode pads 172 and 174 disposed at two opposite ends thereof, respectively.

Figure 3D:
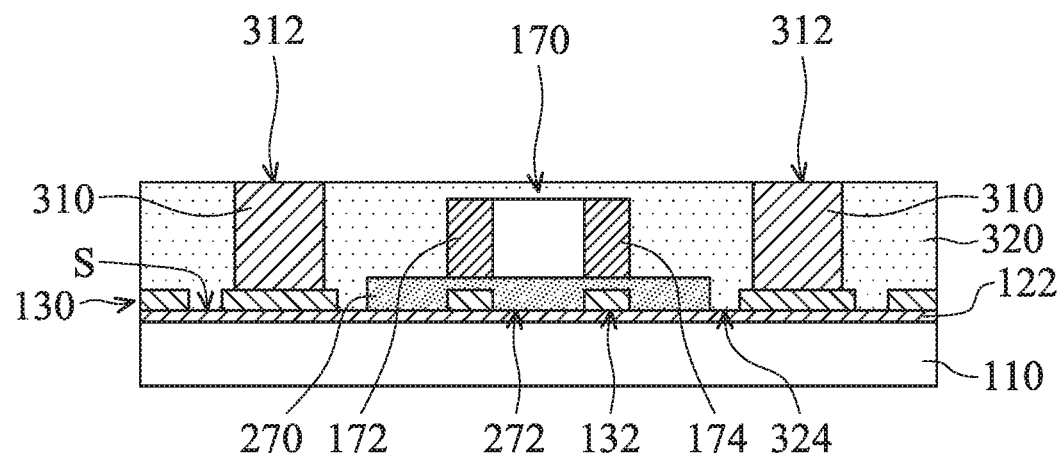

As shown in FIG. 3D, a pre-molding process is performed to form a dielectric layer 320 on the conductive layer 122 (or the carrier 110) so as to cover the passive component 170, the circuit layer 130 and the adhesive layer 270. The dielectric layer 320 includes epoxy, acrylate, urethane acrylate or other suitable encapsulating materials. The passive component 170, the circuit layer 130, the conductive pillars 310 and the adhesive layer 270 are embedded in the dielectric layer 320. In one embodiment, the passive component 170, the circuit layer 130, the conductive pillars 310 and the adhesive layer 270 are in direct contact with the dielectric layer 320.

Since the dielectric layer 320, the adhesive layer 270 and the circuit layer 130 are formed on a surface S of the conductive layer 122, a surface 324 of the dielectric layer 320, a surface 272 of the adhesive layer 270 and a surface 132 of the circuit layer 130 are aligned with each other. In one embodiment, the dielectric layer 320 covers top surfaces 312 of the conductive pillars 310, and therefore a grinding process is performed to remove the portion of the dielectric layer 320 covering the top surfaces 312 so as to expose the top surfaces 312.

Figure 3E:
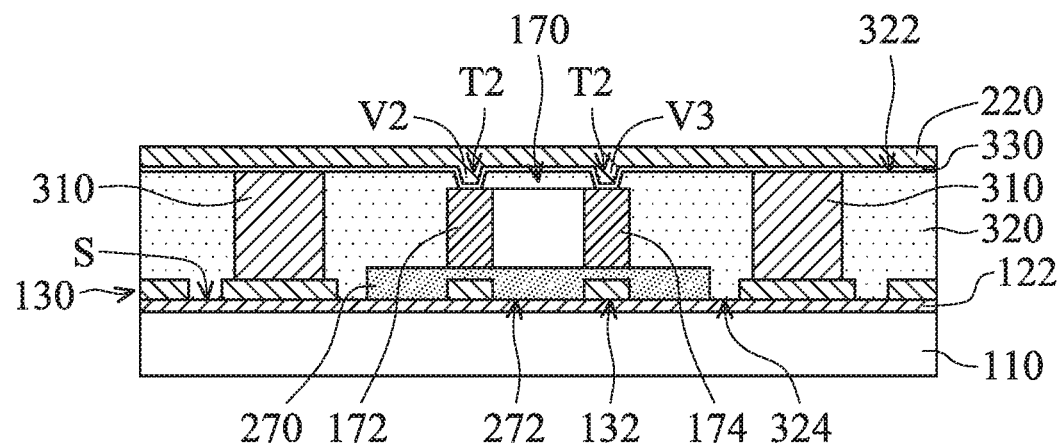

As shown in FIG. 3E, holes T2 are formed to pass through the dielectric layer 320. In one embodiment, an electroless plating process is performed to form a seed layer 330 on a surface 322 of the dielectric layer 320 and sidewalls of the holes T2. The seed layer 330 includes copper or other suitable conductive materials. Thereafter, a conductive layer 220 is formed on the seed layer 330 by, for example, an electroplating process. The conductive layer 220 fills the holes T2 to form conductive vias V2 and V3.

Figure 3F:
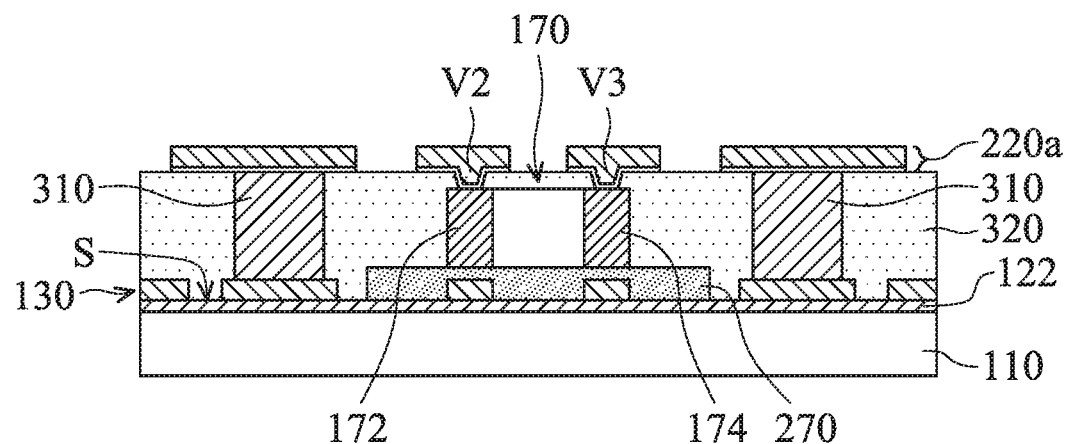

Afterwards, as shown in FIGS. 3E and 3F, the seed layer 330 and the conductive layer 220 are patterned to form a circuit layer 220a. The patterning process includes, for example, a photolithography process and an etching process. The circuit layer 220a is electrically connected to the conductive pillars 310.

The conductive via V2 passes through the dielectric layer 320 and is electrically connected to the circuit layer 220a and the electrode pad 172 of the passive component 170. The conductive via V3 passes through the dielectric layer 320 and is electrically connected to the circuit layer 220a and the electrode pad 174 of the passive component 170.

Figure 3G:
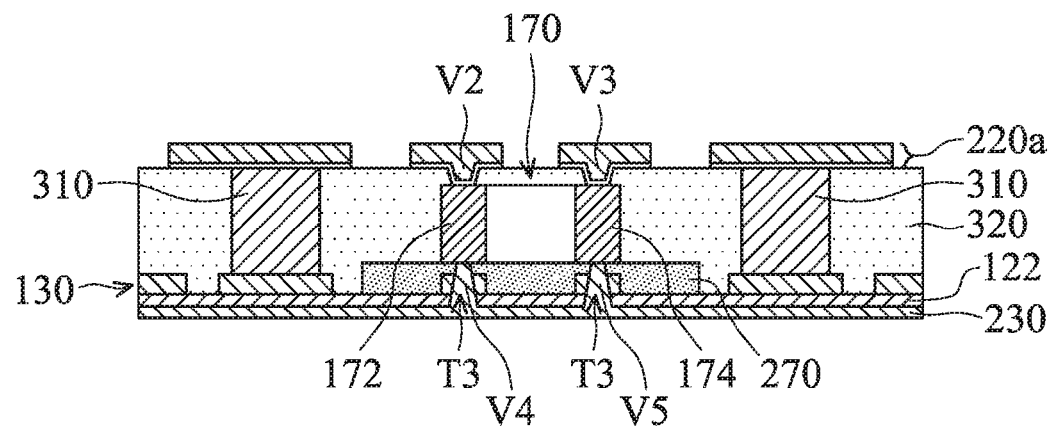
Figure 3H:
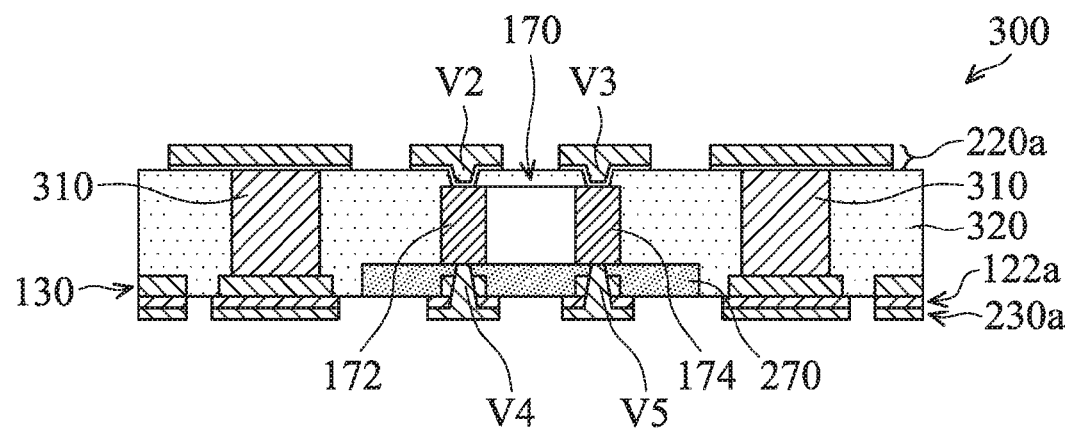

Afterwards, as shown in FIG. 3G, the carrier 110 is removed. Holes T3 are formed to pass through the conductive layer 122, the circuit layer 130 and the adhesive layer 270 by, for example, a laser drilling process. Then, a conductive layer 230 is formed on the conductive layer 122 by, for example, an electroplating process, and the conductive layer 230 fills the holes T3 to form conductive vias V4 and V5. As shown in FIG. 3H, the conductive layers 122 and 230 are patterned to form circuit layers 122a and 230a. In this step, a package substrate 300 is substantially formed.

Figure 3I:
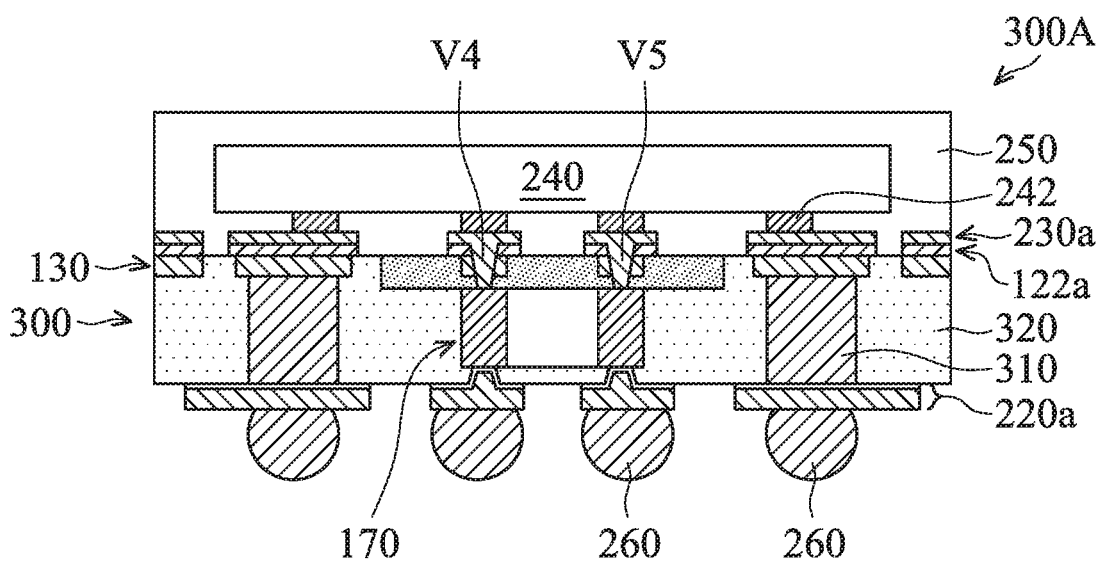

As shown in FIG. 3I, the package substrate 300 is flipped up. In one embodiment, a chip 240 is bonded onto the circuit layer 230a via conductive bumps 242 formed under the chip 240. The chip 240 is electrically connected to the passive component 170 through the circuit layer 230a and the conductive vias V4 and V5.

A molding process is optionally performed to form an encapsulating layer 250 on the package substrate 300 and covering (or encapsulating) the chip 240. The encapsulating layer 250 includes epoxy, acrylate, urethane acrylate or other suitable encapsulating materials. In one embodiment, the encapsulating layer 250 and the dielectric layer 320 have the same material. Solder balls (or conductive bumps) 260 are formed on the circuit layer 220a. In this step, a chip package 300A of the present embodiment is substantially formed.

In the present embodiment, a pre-molding process is performed to embed the passive component 170 into the dielectric layer 320 so as to form the package substrate 300, and therefore the package substrate 300 of the present embodiment does not need to use a core layer. Therefore, the present embodiment may reduce the manufacturing cost of package substrates and chip packages.

FIGS. 4A-4I are cross-sectional views showing the steps of forming a chip package in accordance with an embodiment of the present invention. It should be noted that some of the elements of FIGS. 4A-4I are the same as or similar to those of FIGS. 1A-1I, FIGS. 2A-2I and FIGS. 3A-3I, and therefore same or similar reference numbers are used to designate same or similar elements. A detailed description of elements that are the same or similar to those in FIGS. 1A-1I, FIGS. 2A-2I and FIGS. 3A-3I is not repeated herein.

Figure 4A:
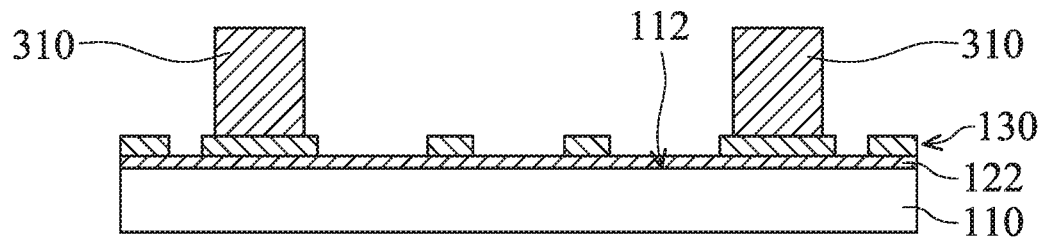
FIGS. 4A-4I are cross-sectional views showing the steps of forming a chip package in accordance with an embodiment of the present invention.

As shown in FIG. 4A, a carrier 110, conductive layer 122, a circuit layer 130 and conductive pillars 310 are provided. The conductive layer 122, the circuit layer 130 and the conductive pillars 310 are stacked on a surface 112 of the carrier 110 sequentially. The conductive pillars 310 are disposed on the circuit layer 130 and are configured to be conductive vias of a chip package subsequently formed. The conductive pillars 310 include copper or other suitable conductive materials. The conductive pillars 310 are formed by, for example, an electroplating process.

Figure 4B:
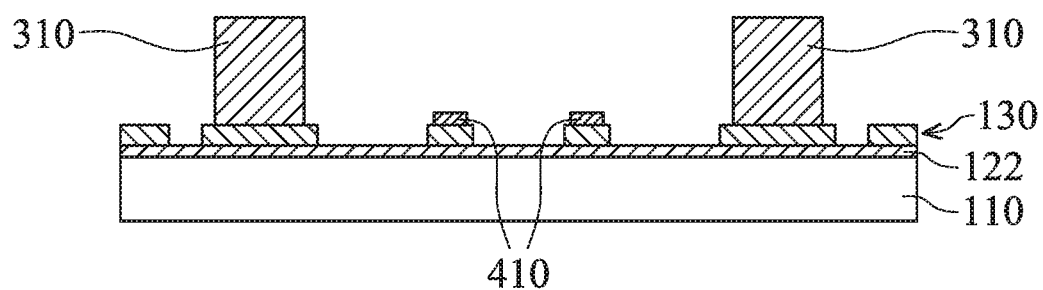

Thereafter, as shown in FIG. 4B, an adhesive layer 410 is formed on the circuit layer 130 by, for example, a printing process. The adhesive layer 410 includes a solder paste including tin (Sn) or other suitable conductive materials.

Figure 4C:
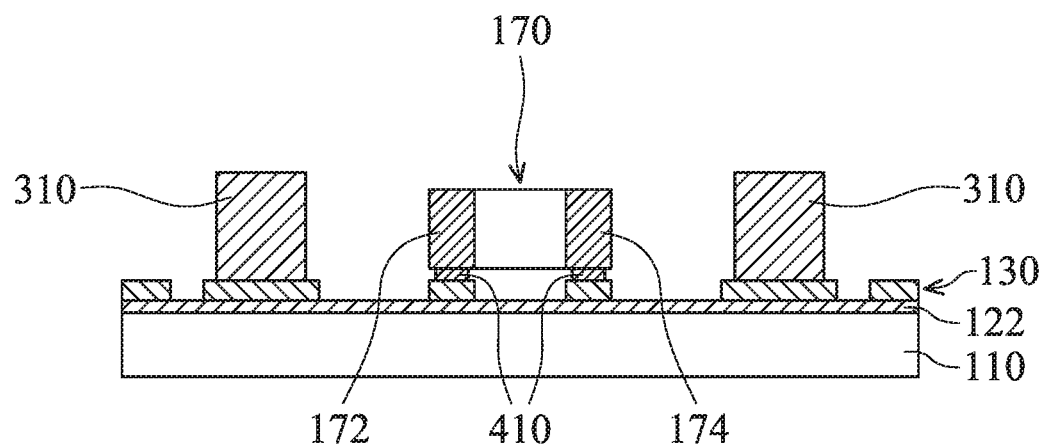

Afterwards, as shown in FIG. 4C, a passive component 170 is disposed on the adhesive layer 410 to be adhered on the carrier 110 (or the circuit layer 130). In one embodiment, after disposing the passive component 170, a reflow process is performed to help the adhesive layer 410 to adhere to the passive component 170 and the circuit layer 130. In one embodiment, the passive component 170 has electrode pads 172 and 174 disposed at two opposite ends thereof, respectively. The electrode pads 172 and 174 are connected to the adhesive layer 410, respectively.

Figure 4D:
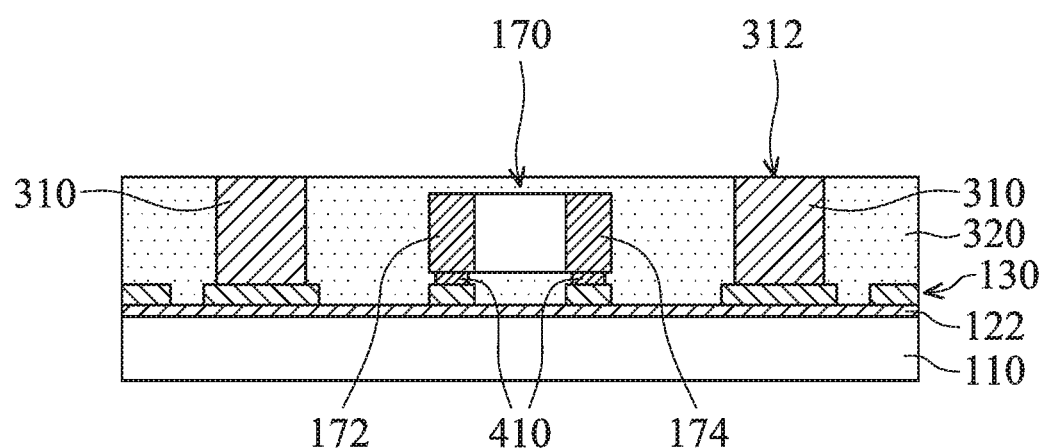

As shown in FIG. 4D, a pre-molding process is performed to form a dielectric layer 320 on the conductive layer 122 (or the carrier 110) so as to cover the passive component 170, the circuit layer 130 and the adhesive layer 410. The passive component 170, the circuit layer 130, the conductive pillars 310 and the adhesive layer 410 are embedded in the dielectric layer 320. In one embodiment, the passive component 170, the circuit layer 130, the conductive pillars 310 and the adhesive layer 410 are in direct contact with the dielectric layer 320.

In one embodiment, the dielectric layer 320 covers top surfaces 312 of the conductive pillars 310, and therefore a grinding process is performed to remove the portion of the dielectric layer 320 covering the top surfaces 312 so as to expose the top surfaces 312.

Figure 4E:
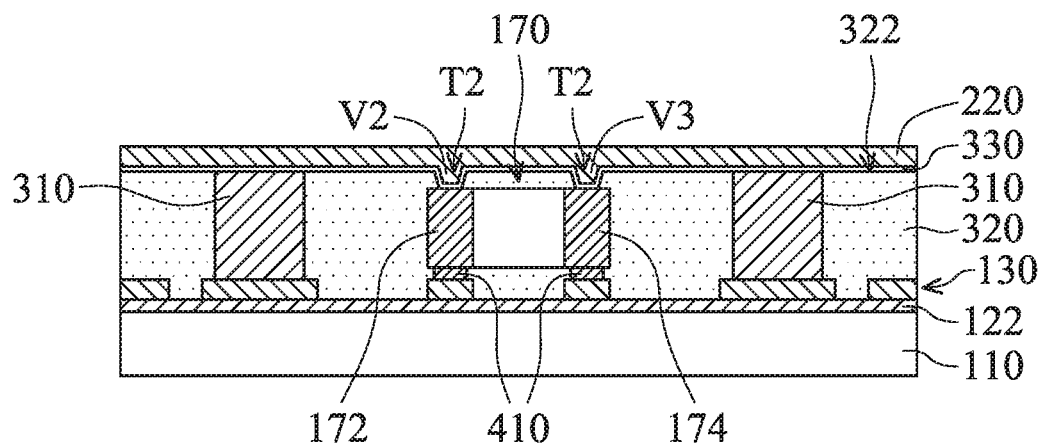

As shown in FIG. 4E, holes T2 are formed to pass through the dielectric layer 320. In one embodiment, an electroless plating process is performed to form a seed layer 330 on a surface 322 of the dielectric layer 320 and sidewalls of the holes T2. The seed layer 330 includes copper or other suitable conductive materials. Thereafter, a conductive layer 220 is formed on the seed layer 330 by, for example, an electroplating process. The conductive layer 220 fills the holes T2 to form conductive vias V2 and V3.

Figure 4F:
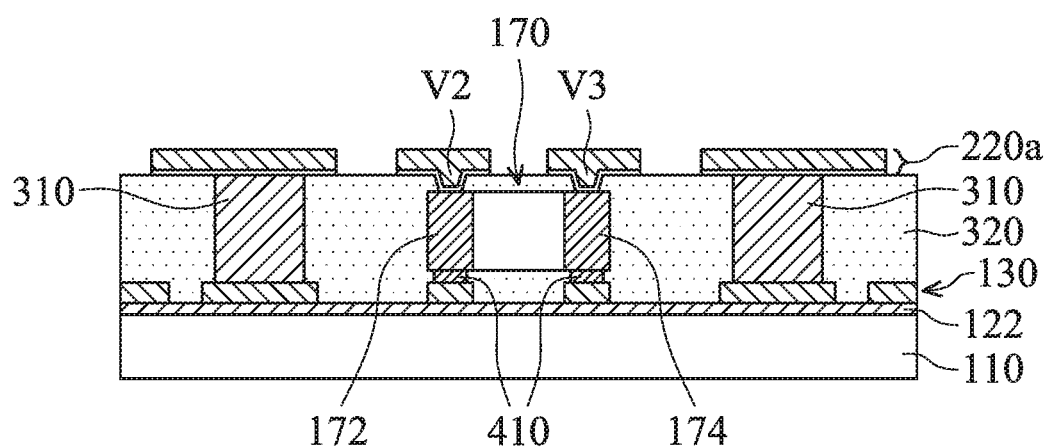

Afterwards, as shown in FIGS. 4E and 4F, the seed layer 330 and the conductive layer 220 are patterned to form a circuit layer 220a. The patterning process includes, for example, a photolithography process and an etching process. The circuit layer 220a is electrically connected to the conductive pillars 310.

The conductive via V2 passes through the dielectric layer 320 and is electrically connected to the circuit layer 220a and the electrode pad 172 of the passive component 170. The conductive via V3 passes through the dielectric layer 320 and is electrically connected to the circuit layer 220a and the electrode pad 174 of the passive component 170.

Figure 4G:
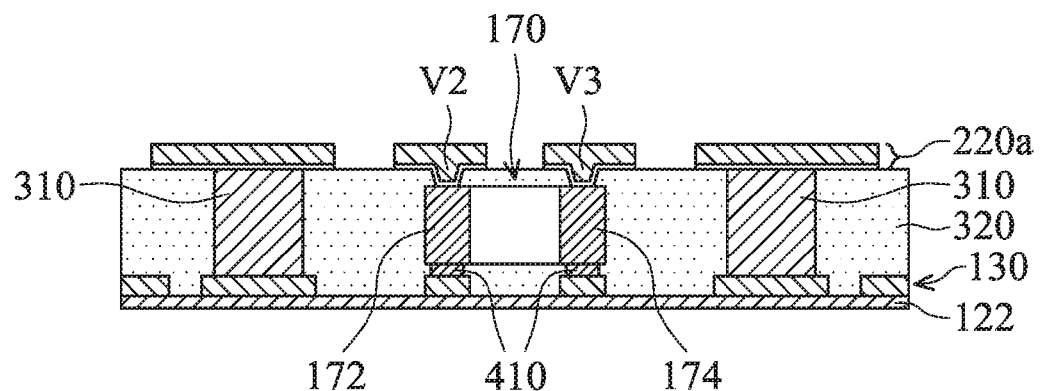
Figure 4H:
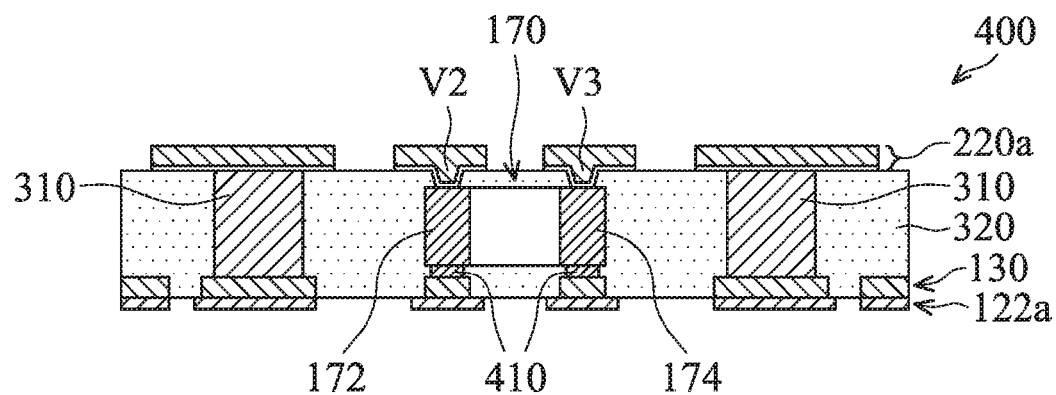
Figure 4I:
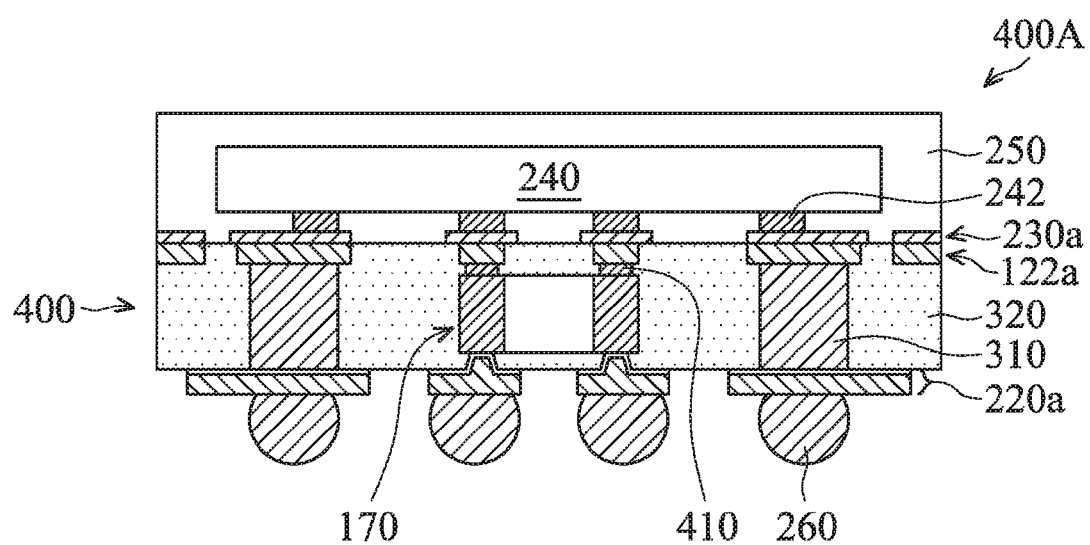

Afterwards, as shown in FIG. 4G, the carrier 110 is removed. As shown in FIG. 4H, the conductive layer 122 is patterned to form a circuit layer 122a. In this step, a package substrate 400 is substantially formed. As shown in FIG. 4I, the package substrate 400 is flipped up. In one embodiment, a chip 240 is bonded onto the circuit layer 230a via conductive bumps 242 formed under the chip 240. The chip 240 is electrically connected to the passive component 170 through the circuit layer 230a and 122a and the adhesive layer 410.

A molding process is optionally performed to form an encapsulating layer 250 on the package substrate 400 and covering (or encapsulating) the chip 240. Solder balls (or conductive bumps) 260 are formed on the circuit layer 220*a*. In this step, a chip package 400A of the present embodiment is substantially formed.

In view of the foregoing, in the present invention, a lamination process or a pre-molding process is performed to embed a passive component into a dielectric layer so as to form a package substrate, and therefore the package substrate of the present invention does not need to use a core layer. Therefore, the present invention may reduce the manufacturing cost of package substrates and chip packages.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A manufacturing method of a package substrate, comprising:
    forming a conductive layer on a carrier;
    forming a first circuit layer on the conductive layer;
    disposing a passive component on the first circuit layer and the carrier;
    forming a dielectric layer and an adhesive layer on the carrier to embed the passive component and the first circuit layer in the dielectric layer, wherein the first dielectric material layer has a cavity exposing a portion of the adhesive layer;
    forming a second circuit layer on the dielectric layer;
    removing the carrier from the conductive layer; and
    patterning the conductive layer.

2. The manufacturing method of a package substrate as claimed in claim 1, wherein the disposing of the passive component and the forming of the dielectric layer comprises:
    disposing the passive component in the cavity to be adhered on the adhesive layer;
    forming a second dielectric material layer on the carrier and adjacent to the first circuit layer;
    stacking the passive component, the first dielectric material layer and the adhesive layer on the carrier; and
    performing a lamination process to combine the first dielectric material layer with the second dielectric material layer so as to form the dielectric layer.

3. The manufacturing method of a package substrate as claimed in claim 2, wherein the first circuit layer has a first surface aligned with a second surface of the dielectric layer and the adhesive layer is on a third surface of the dielectric layer, and the third surface is opposite to the second surface.

4. The manufacturing method of a package substrate as claimed in claim 1, wherein the disposing of the passive component and the forming of the dielectric layer comprises:
    performing a lamination process to laminate the dielectric layer on the carrier so as to cover the passive component, the first circuit layer and the adhesive layer.

5. The manufacturing method of a package substrate as claimed in claim 4, wherein the first circuit layer has a first surface aligned with a second surface of the dielectric layer and the adhesive layer has a fourth surface aligned with the first surface of the circuit layer and the second surface of the dielectric layer.

6. The manufacturing method of a package substrate as claimed in claim 4, wherein the adhesive layer is adhered to both the passive component and the first circuit layer, and the adhesive layer comprises an insulating material and a conductive material in the insulating material so as to electrically connect the passive component to the first circuit layer.

7. The manufacturing method of a package substrate as claimed in claim 1, wherein the disposing of the passive component and the forming of the dielectric layer comprises:
    performing a pre-molding process to form the dielectric layer on the carrier so as to cover the passive component, the first circuit layer and the adhesive layer.

8. The manufacturing method of a package substrate as claimed in claim 7, wherein the adhesive layer is adhered to both the passive component and the first circuit layer, and the adhesive layer comprises an insulating material and a conductive material in the insulating material so as to electrically connect the passive component to the first circuit layer.

9. The manufacturing method of a package substrate as claimed in claim 7,
    wherein the adhesive layer comprises a conductive material.

10. The manufacturing method of a package substrate as claimed in claim 9, wherein the adhesive layer is adhered to both the passive component and the first circuit layer, and the adhesive layer comprises a conductive material to electrically connect the passive component to the first circuit layer.

11. A manufacturing method of a chip package, comprising:
    forming a conductive layer on a carrier;
    forming a first circuit layer on the conductive layer;
    disposing a passive component on the first circuit layer and the carrier;
    forming a dielectric layer and an adhesive layer on the carrier to embed the passive component and the first circuit layer in the dielectric layer, wherein the first dielectric material layer has a cavity exposing a portion of the adhesive layer;
    forming a second circuit layer on the dielectric layer;
    removing the carrier from the conductive layer;
    patterning the conductive layer; and
    disposing a chip on the first circuit layer, wherein the chip is electrically connected to the first circuit layer and the passive component.

12. The manufacturing method of a chip package as claimed in claim 11, wherein the disposing of the passive component and the forming of the dielectric layer comprises:
    disposing the passive component in the cavity to be adhered on the adhesive layer;
    forming a second dielectric material layer on the carrier and adjacent to the first circuit layer;
    stacking the passive component, the first dielectric material layer and the adhesive layer on the carrier; and
    performing a lamination process to combine the first dielectric material layer with the second dielectric material layer so as to form the dielectric layer.

13. The manufacturing method of a chip package as claimed in claim 11, further comprising:
    disposing a plurality of solder balls on the second circuit layer.

14. The manufacturing method of a chip package as claimed in claim 11, further comprising:
    covering the chip with an encapsulating layer.

15. The manufacturing method of a chip package as claimed in claim 11, wherein the disposing of the passive component and the forming of the dielectric layer comprises:

performing a lamination process to laminate the dielectric layer on the carrier so as to cover the passive component, the first circuit layer and the adhesive layer.

16. The manufacturing method of a chip package as claimed in claim 15, wherein the adhesive layer is adhered to both the passive component and the first circuit layer, and the adhesive layer comprises an insulating material and a conductive material in the insulating material so as to electrically connect the passive component to the first circuit layer.

17. The manufacturing method of a chip package as claimed in claim 11, wherein the disposing of the passive component and the forming of the dielectric layer comprises performing a pre-molding process to form the dielectric layer on the carrier so as to cover the passive component, the first circuit layer and the adhesive layer.

18. The manufacturing method of a chip package as claimed in claim 17, wherein the adhesive layer is adhered to both the passive component and the first circuit layer, and the adhesive layer comprises an insulating material and a conductive material in the insulating material so as to electrically connect the passive component to the first circuit layer.

19. The manufacturing method of a chip package as claimed in claim 11, wherein the disposing of the passive component and the forming of the dielectric layer having a cavity comprises performing a pre-molding process to form the dielectric layer on the carrier so as to cover the passive component, the first circuit layer and the adhesive layer.

20. The manufacturing method of a chip package as claimed in claim 19, wherein the adhesive layer is adhered to both the passive component and the first circuit layer, and the adhesive layer comprises a conductive material to electrically connect the passive component to the first circuit layer.

* * * * *